United States Patent

Nishizawa et al.

[11] Patent Number: 4,484,207
[45] Date of Patent: Nov. 20, 1984

[54] STATIC INDUCTION TRANSISTOR AND SEMICONDUCTOR INTEGRATED CIRCUIT USING HETERO-JUNCTION

[75] Inventors: Jun-ichi Nishizawa; Tadahiro Ohmi; Nobuo Takeda, all of Sendai, Japan

[73] Assignee: Zaidan Hojin Handotai Kenkyu Shinkokai, Sendai, Japan

[21] Appl. No.: 517,381

[22] Filed: Jul. 26, 1983

Related U.S. Application Data

[63] Continuation of Ser. No. 239,645, Mar. 2, 1981.

[30] Foreign Application Priority Data

Mar. 4, 1980 [JP] Japan .................................. 55-27613

[51] Int. Cl.³ .......................................... H01L 29/161
[52] U.S. Cl. ........................................ 357/16; 357/22; 357/59; 357/23
[58] Field of Search ............. 357/23, 1 R, 1 NS, 1 D, 357/59, 16, 22, 23.1, 23.15, 23.2, 23.12

[56] References Cited

U.S. PATENT DOCUMENTS

| | | | |
|---|---|---|---|
| 4,157,556 | 6/1979 | Decker | 357/22 |
| 4,173,764 | 11/1979 | de Cremoux | 357/22 |
| 4,254,429 | 3/1981 | Yamazaki | 357/59 X |
| 4,302,763 | 11/1981 | Oh-uchi et al. | 357/16 |
| 4,320,410 | 3/1982 | Nishizawa et al. | 357/23 X |

OTHER PUBLICATIONS

Nishizawa et al., "Bipolar Mode Static Induction Transistor", *Jap. J. Appl. Phys.*, vol. 19, Suppl. 19-1, pp. 289-293, (1980).

Ross et al., "Heterojunction Transistors with Enhanced Gain", *Electronic Engineering*, vol. 49, No. 589, pp. 35-38, Mar. 1977.

Iwasaki et al., "A Depleted Base Transistor", *Jap. J. of Appl. Phys.*, vol. 17, Supp. 17-1, pp. 245-251, (1978).

Matsushita et al., "A Silicon Heterojunction Transistor", *Appl. Phys. Lett.*, vol. 35, No. 7, pp. 549-550, Oct. 1979.

Oh-uchi et al., "A New Silicon Heterojunction Transistor Using Doped Sipos", IEDM Tech. Dig., (1979), pp. 522-525.

*Primary Examiner*—Martin H. Edlow
*Assistant Examiner*—William A. Mintel
*Attorney, Agent, or Firm*—Cushman, Darby & Cushman

[57] ABSTRACT

A hetero-junction static induction transistor (SIT) of normal or upside-down type to be operated by applying a forward bias across the gate and source regions, in which at least its source region and gate region among the source, drain and gate regions is formed with a material having a band gap broader than that of the channel region. Such a SIT provides a large current amplification factor, improved frequency characteristics and is suitable for high power operation and for use in semiconductor integrated circuits.

5 Claims, 18 Drawing Figures

STATIC INDUCTION TRANSISTOR AND SEMICONDUCTOR INTEGRATED CIRCUIT USING HETERO-JUNCTION

This is a continuation of application Ser. No. 239,645, filed Mar. 2, 1981.

BACKGROUND OF THE INVENTION (a) Field of the invention

The present invention concerns a static induction transistor having hetero-junction and semiconductor integrated circuit containing such transistor.

(b) Description of the prior art

A static induction transistor (hereinafter referred to as "SIT") is a new semiconductor device recently developed by J. Nishizawa, one of the inventors of the present invention, and has such excellent characteristics that it deserves being called a third type of transistor comparable to the bipolar transistor, (usually referred to simply as "transistor"), or to the unipolar field effect transistor (referred to as "FET"). The electric characteristics and the operating mechanism of the SIT was reported first in IEEE Trans. on Electronic Devices, vol. ED-22, pp 185-197, 1975. Thereafter, there have been conceived and proposed various applications of the SIT, utilizing the superior features thereof. The principle of operation of the SIT will now be briefly explained for clarity's sake.

Figure 1:
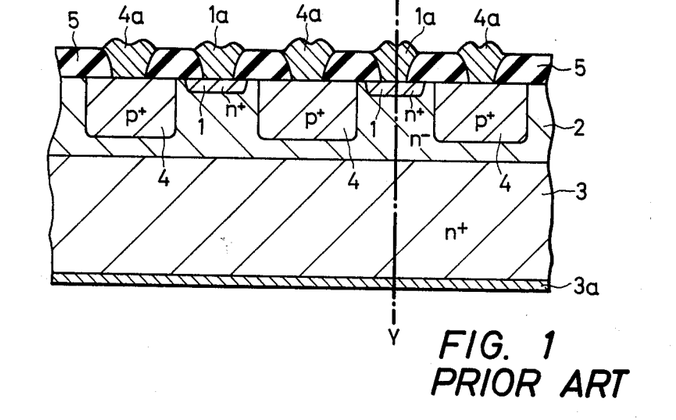
FIG. 1 is a diagrammatic sectional view, showing the structure of a known junction SIT.

An example of the structure of a known junction SIT is shown in FIG. 1. In the Figure, reference numeral 1 represents an n+ type source region having a high impurity concentration of the order of $10^{18}$–$10^{21}$ atoms/cm$^3$. A source electrode 1a which is in ohmic contact with the n+ type source region 1. An n− type channel region 2 having a low impurity concentration of about $10^{12}$–$10^{15}$ atoms/cm$^3$ plays an important role in operation of the SIT. It should be understood, however, that this n− type channel region is such that its conductivity type need not be n− type, but it may be a p− type region having an impurity concentration of about $10^{13}$–$10^{16}$ atoms/cm$^3$. A p+ type gate region 4 has an impurity concentration of about $10^{18}$–$10^{20}$ atoms/cm$^3$. A gate electrode 4a which is in ohmic contact with said p+ type gate region 4. An n+ type drain region 3, cooperates with a drain electrode 3a which is in ohmic contact with said n+ type drain region 3. An insulating film 5 is formed with a material such as an oxide film. Across the source and the gate electrodes is formed a pn junction, so that when a reverse bias is applied thereacross, a depletion layer is formed in the channel region 2. Application of more intensive reverse bias will result in the growth of a broader depletion layer, and the condition in which the entire channel region is depleted can occur. It will be understood that if the width of the channel region is short and if the impurity concentration of the channel region is low, the channel region is easily depleted by the application of a low reverse bias. Depending on the design, the channel region will become depleted by the built-in potential alone (the externally applied voltage is nil), and thus the phenomenon that the channel region becomes a space charge region readily takes place.

Figure 2:
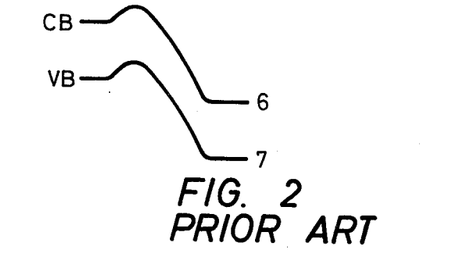
FIG. 2 is a schematic energy band diagram as viewed along the line X-Y in FIG. 1.

If the channel region has become depleted as stated above, and an appropriated voltage is applied to the drain, the energy band structure at the center of the channel (indicated by line X-Y in FIG. 1) will become as shown in FIG. 2. The numeral 6 indicates the bottom of the conduction band CB, and the numeral 7 represents the top of the valence band VB. The flat region at the left-hand side indicates the potential at the n+ type source region 1, while the flat region at the right-hand side represents the potential at the n+ type drain region 3. There appears a potential barrier in front of the source region as shown in FIG. 2. In such condition, the electrons (which are the majority carriers in the n+ type source region 1) are unable to flow into the drain region side; electron flow is obstructed by the potential barrier developed in the channel region 2. Therefore, either by reducing the reverse voltage applied to the gate region or by applying a drain voltage, the potential barrier can be lowered due to electrostatic induction, to cause the electrons in the source region to flow to the drain. Thus, the mechanism of operation of the SIT resembles the operating principle of a triode vacuum tube, and the I-V characteristic of the SIT also resembles that of the triode vacuum tube.

As briefly explained above, a SIT is a transistor designed to control the amount of the majority carriers flowing from the source region to the drain region by varying electrostatically the potential distribution within the depletion layer developed in the channel region, i.e. the space charge region. Particularly the height of the potential barrier (portion higher than the bottom of the conduction band of the source region), by utilizing the voltage applied to the gate region and also by the voltage applied to the drain region. Voltage variation across the gate and source regions intensively contributes to the operation of this SIT. However, the current flowing across the gate and source regions is irrelevant and altogether unnecessary for the operation of the SIT. In other words, an SIT is a transistor having a current amplification factor which can be considered essentially infinite. In an SIT which is designed to have a narrow or small channel width and/or a low channel region impurity concentration, so that the depletion layer extends throughout the entire channel region without an applied reverse voltage to the gate-source pn junction, i.e. depleted by the built-in potential, the SIT will provide a so-called "normally-off" characteristic, whereby no drain current will flow unless a substantially high voltage is applied to the drain region. On the other hand, in an SIT of the type that no potential barrier is developed in the absence of a gate voltage, characteristic will be manifested, whereby called "normally-on" type drain current will begin to flow readily by the application of a drain voltage, because there is no potential barrier present. Normally-off type SITs are typically utilized in high-speed switching device, a memory device, and semiconductor integrated circuit, applications. In order to provide a normally-off semiconductor device, it is necessary to determine the impurity concentration of the channel region, taking into account the gate-to-gate distance, as well as the length of the channel to insure that the channel region is completely depleted in response to the built-in potential at the pn junction across the channel region and the p+ type gate region. Moreover, the channel length must be made longer than a certain value, for example, the gate-to-gate distance, to realize an excellent normally-off characteristic.

An application of forward gate bias voltage on the normally-off SIT tends to enable the drain current to flow. Forward gate bias operation of the normally-off SIT is called "bipolar mode SIT" (BSIT). BSIT has been demonstrated experimentally to be characterized by high current density in the "on" state irrespective of the relatively low impurity concentration in the channel, high-transconductance, low on-voltage, low impedance characteristic and so forth. The features of BSIT are very favorable to integrated circuit applications, because of its low power dissipation, high driving capability, high speed switching and so on.

Where a normally-off type SIT is used to perform, for example, a switching operation, i.e. it is intended to change the drain current from the "off" state to the "on" state, it is more desirable to lower the potential barrier to a certain lower level or to zero, and to change the "off" state to the "on" state by applying a forward bias across the pn junction between the gate and source region under a given constant drain voltage applied, rather than lowering the potential barrier and causing a drain current to flow by the application of a more intensive drain voltage.

It should be noted, however, that in such arrangement of device as described above, the gate-source pn junction, can give rise to various problems and hence to accompanying undesirable phenomenons. That is, if a pn junction is formed across the gate and source regions, an application of a forward bias will result in mutual injections of minority carriers into the gate and source regions, causing a gate current to flow. Here, it will be noted that in view of the impurity concentrations of the p+ type gate region and the n− type channel region, most of the minority carrier injection takes place from the gate region into the source region. If this minority carrier injection takes place, and causes a gate current flow, a marked lowering of the current gain (which otherwise can take a value nearly infinite) will result. Not only does a lowering of the current amplification factor result from such leakage current, but also, due to the storage effect due to the prolonged relaxation time or prolonged lifetime of the injected minority carriers, the frequency characteristic of the operation of an SIT is degraded. Also, if a known junction SIT which is operated at forward gate bias is incorporated in a semiconductor integrated circuit, the minority carrier injection will become a limiting factor on the number of fan-outs to be taken and the propagation delay time which are the features of the integrated circuit.

Basic transport phenomenon in BSIT will be briefly described hereinafter by using a rectangular channel device, where the gate-to-gate distance is denoted by D, and the source-to-drain distance, i.e., the channel length in this device, is defind by L. The transport phenomenon has been introduced by using the numerical simulation based on Poisson's equation and carrier continuity equations.

Figure 3:
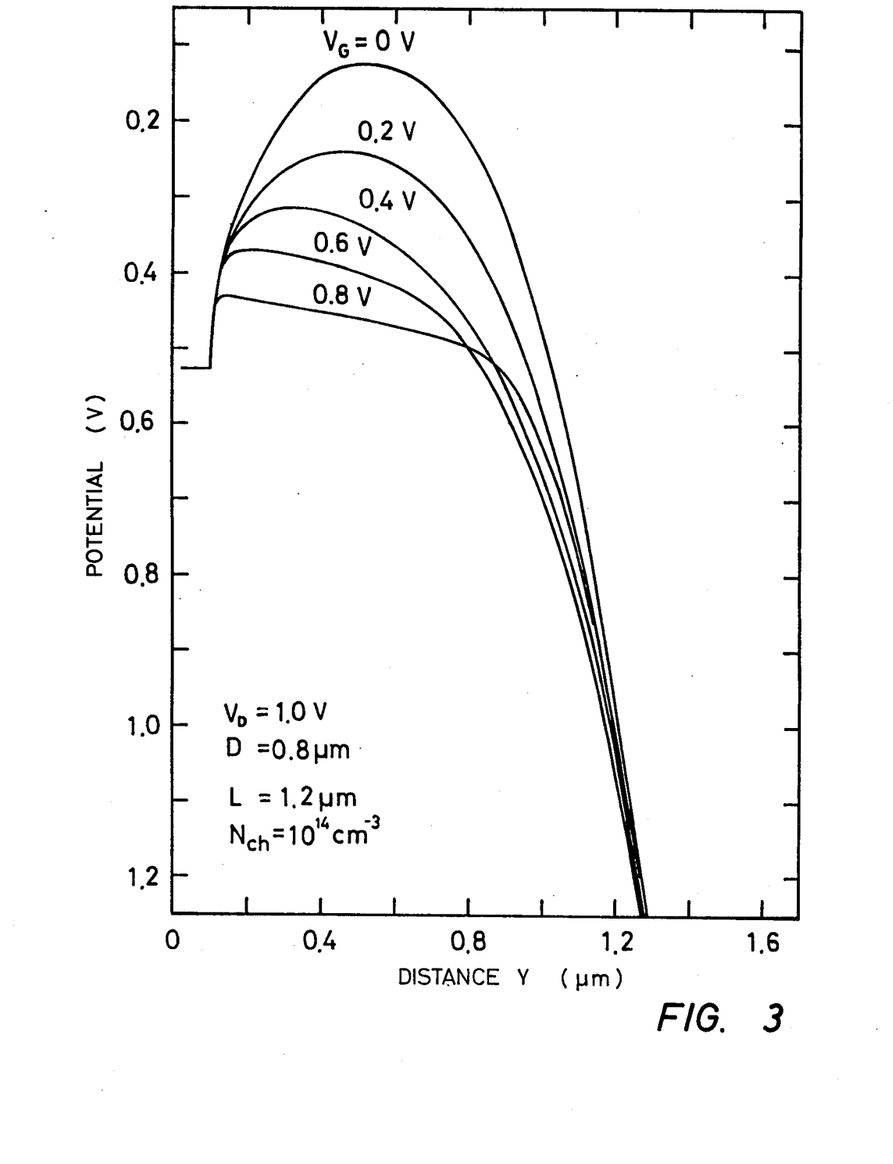
FIG. 3 is a chart showing source-to-drain potential distributions along the channel center for various gate bias voltages.
Figure 4:
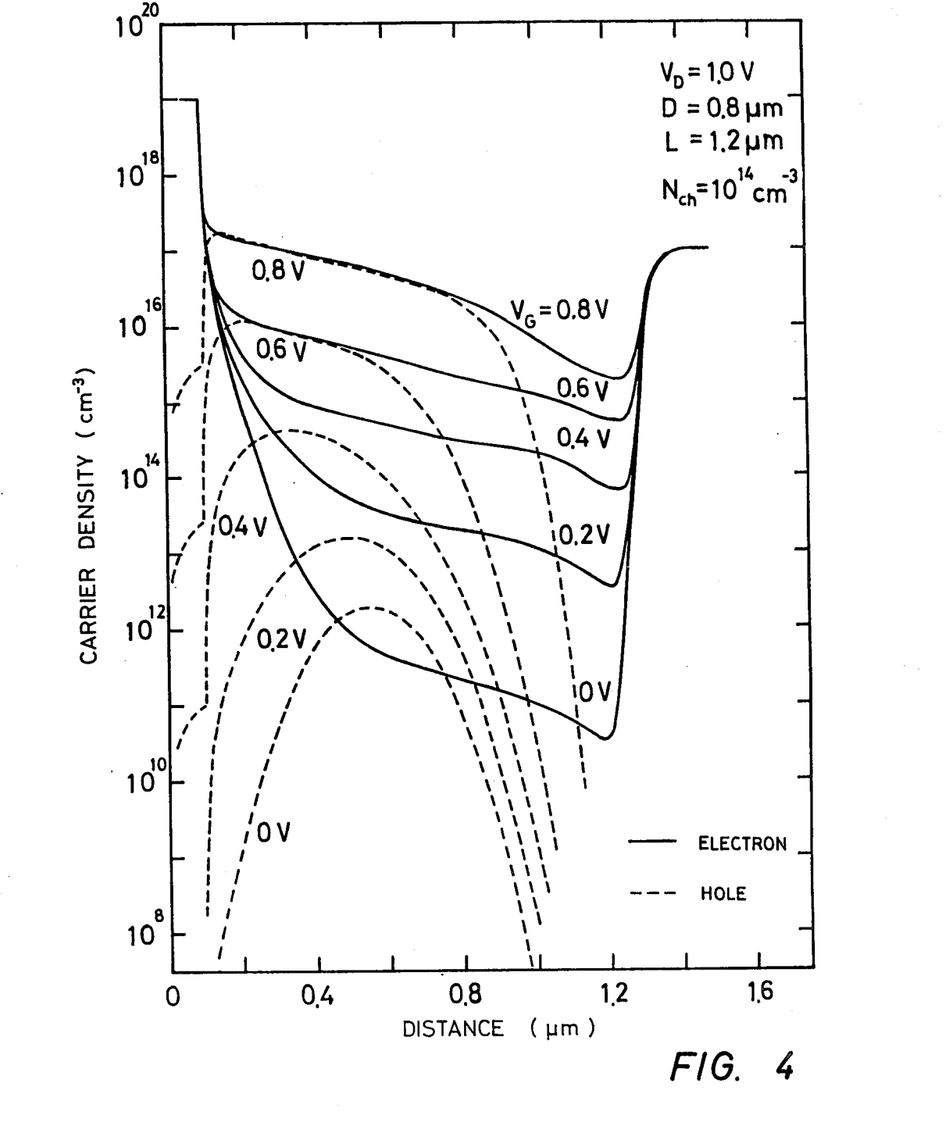
FIG. 4 is a chart showing the spatial distribution of electron and hole density along the channel center for various gate bias voltages.

Source-to-drain potential distributions along the channel center are illustrated for various gate bias voltages $V_G$ in FIG. 3, where the drain voltage is set at 1.0 V. Typical device parameters are as follows. The values of D and L are 0.8 μm, and 1.2 μm, respectively. The impurity concentration is $1 \times 10^{14}$ cm$^{-3}$ in the channel, $1 \times 10^{19}$ cm$^{-3}$ in the source region, $1 \times 10^{18}$ cm$^{-3}$ in the gate region and $1 \times 10^{17}$ cm$^{-3}$ in the drain region. FIG. 4 shows the spatial distribution of electron and hole concentrations from source to drain along the channel center for the same operational condition as in FIG. 3, where the solid line represents the electron concentration, and the dashed line represents the hole concentrations. Spatial distribution of the electron and the hole concentration in the crosswise direction of the channel passing through the potential barrier height is shown for the same operational condition in FIG. 5, where the solid line represents the electron concentration and the dashed line represents the hole concentration. The increase of the gate bias voltage decreases the potential barrier height, and tends to move the barrier height location toward the source. The electron and hole concentration in the channel will increase with an increase in the gate bias voltage. In response to low gate bias voltages, injected electrons flowing from the source region tend to combined around the channel center, while they distribute almost uniformly over the cross-sectional direction of the channel between paired gates at the high gate bias voltages such as 0.8 V. At $V_G=0.8$ V, the hole concentration is nearly equal to the electron concentration in the channel near the source region. FIG. 3 indicates that there appears a virtual drift base region in the channel where the space charge is almost completely compensated for due to the injected electrons and the injected holes.

Figure 5:
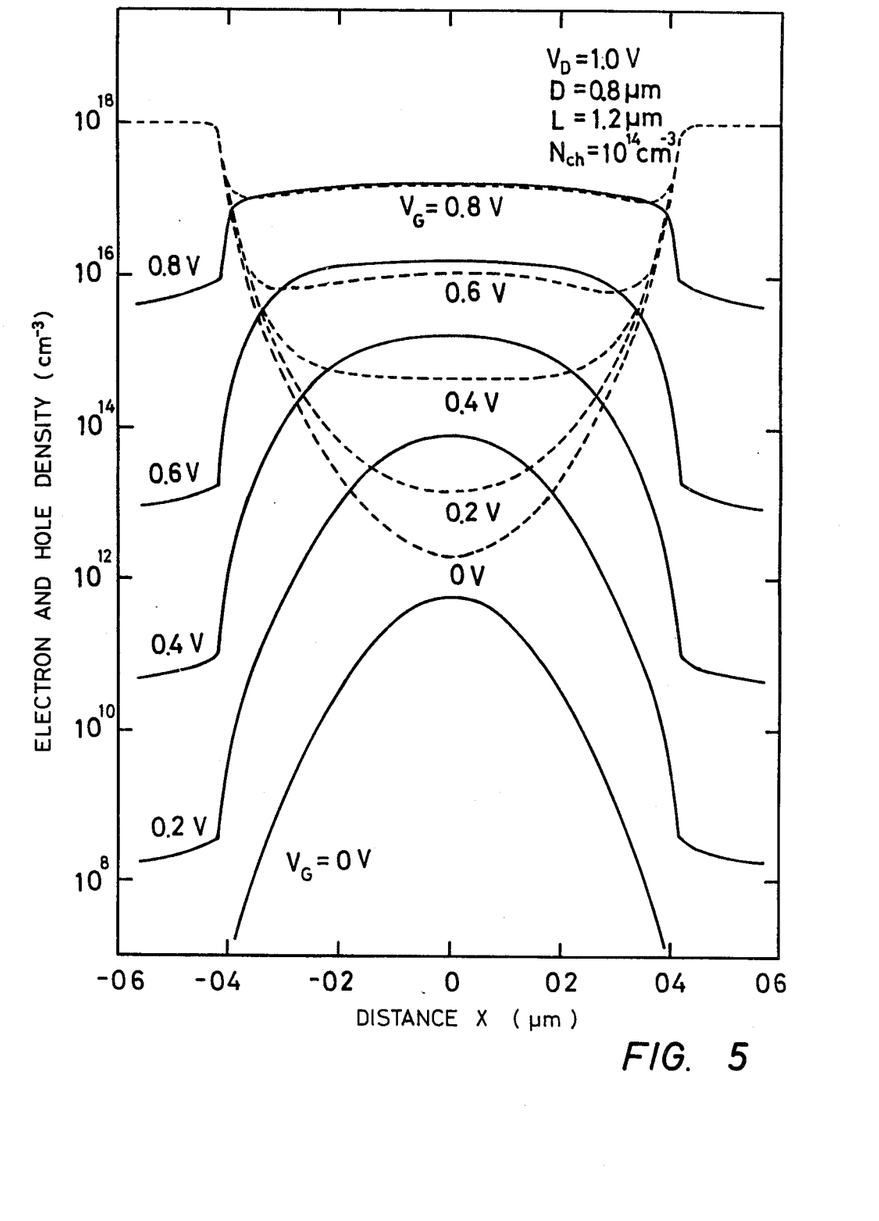
FIG. 5 is a chart showing the spatial distribution of the density of electron and hole passing through the potential barrier, as viewed in the crosswise direction of the channel.

FIGS. 4 and 5 indicate that electrons are injected into the channel from the source region and their concentration is over $1 \times 10^{17}$ cm$^{-3}$ in spite of the low impurity concentration in the channel (such as $1 \times 10^{14}$ cm$^{-3}$). This fact insures the basic characteristics of BSIT such as high current density, high transconductance and so on. A BSIT usually exhibits a saturating current-voltage characteristic which seems to originate from the appearance of the virtual base region in the channel.

FIG. 4 indicates that there exists hole injection from the channel to the n+ type source region where the injected hole concentration is about $3 \times 10^{15}$ cm$^{-3}$ in the source region at $V_G=0.8$ V. On the other hand, FIG. 5 indicates the existence of electron injection from the channel to the p+ type gate region. Their amount is up to $1 \times 10^{16}$ cm$^{-3}$ at $V_G=0.8$ V. The minority carrier injection into the source and the gate region from the channel constitutes the gate current, and increases its magnitude, thus leading to a decrease in the current gain of BSIT, at high gate bias operation. The number of fan-outs is determined by the driving capability of inverter transistor and the input impedance or the current gain of the inverter transistor of the subsequent stage. The decrease in the input impedance or the current gain will serve to decrease the number of fan-outs. Propagation delay time is determined mainly by the ratio of the input capacitance to the driving capability. The propagation delay decreased with a decrease in the input capacitance, and with an increase in the driving capability. Also, where an SIT is employed as a switching device or as a memory device, the minority carrier injection will constitute a limitation on the switching characteristic, switching time, memory state or the like.

SUMMARY OF THE INVENTION

It is, therefore, an object of the present invention to provide an SIT having a novel junction structure which solves those various problems of the prior art junction SIT caused by the gate forward current flowing across the gate and source regions due to the injection of minority carriers when the SIT is operated by applying a forward bias across the gate and source regions. It is also an object to provide a semiconductor integrated circuit using such a novel SIT.

In order to attain this object of the present invention, the junction SIT is arranged so that its source region or its gate region or both employ a semiconductor material having a band gap greater than that of the semiconductor material employed to form the channel region of the SIT.

DETAILED DESCRIPTION OF THE PREFERRED EMBODIMENTS

Description will hereunder be made of an SIT having a channel region which is made of silicon.

The band gap of silicon is known to be about 1.1 eV. Therefore, the source region is formed with a semiconductor material having a band gap broader than that of silicon. An example of such semiconductor material, is Semi-Insulating Polycrystalline Silicon (SIPOS) doped with an impurity. The band gap of SIPOS can vary depending on such factors as the mixing ratio of silicon and oxygen. If the SIPOS contains an impurity phosphor (P) and has a composition consisting of 55.4% silicon, 44.0% oxygen and 0.6% phosphor, the band gap of such SIPOS is about 1.5 eV, and thus greater than that of silicon. Where such SIPOS is used as the source region of an SIT having its channel region formed with silicon a hetero-junction is thereby formed between the source region and the gate region.

Figure 6:
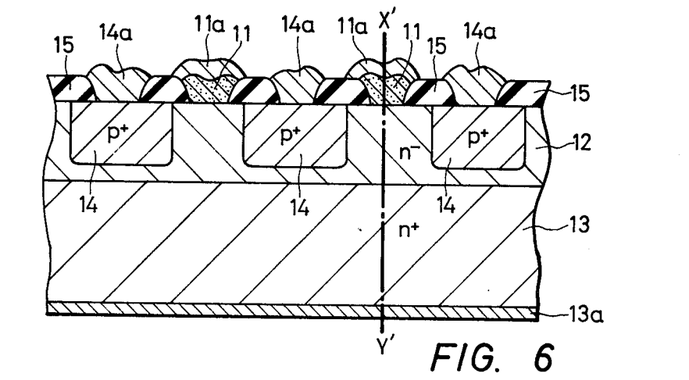
FIG. 6 is a diagrammatic sectional view, showing a hetero-junction normal SIT structure locally having a doped SIPOS.

FIG. 6 shows a sectional view of the structure of an embodiment of the SIT having a source region 11 formed with SIPOS doped with an impurity and having a semiconductor substrate formed with silicon, thus having a channel region 12 made of silicon. Channel 12 is an n⁻ type channel region. Numeral 14 denotes p⁺ type gate region, and numeral 15 denotes an insulating film such as an oxide film. Numerals 11a, 13a and 14a denote electrodes, respectively, which are in ohmic contact with the source region 11, the drain region 13 and the gate region 14, respectively. For the case of such n⁻ type channel region 12 as shown in FIG. 6, the SIPOS which serves as the source region 11 can be formed as an n type semiconductor merely by doping the SISPOS with phosphor (P). For the case of a p-channel SIT, the SIPOS can be formed as semiconductor by doping the SIPOS with boron (B).

Figure 7:
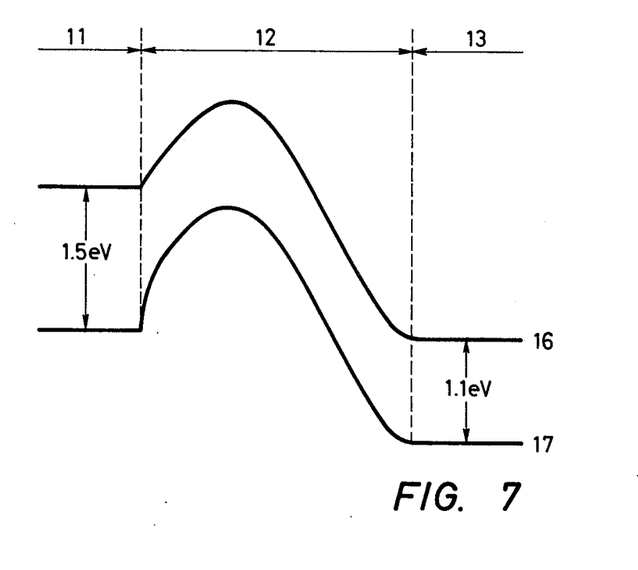
FIG. 7 is a schematic energy band diagram as viewed along the line X'-Y' in FIG. 6.

In the SIT structure shown in FIG. 6, the energy band structure as viewed from the source region toward the drain region (X'-Y') at the center of the channel region is shown in FIG. 7. Numeral 16 denotes the bottom of conduction band, and 17 the top of valence band. It is to be noted that the band gap of the source region 11 is greater than that of the channel region 12. This difference in the band gap is altogether irrelevant to the essentials of the operation of the SIT.

Figure 8:
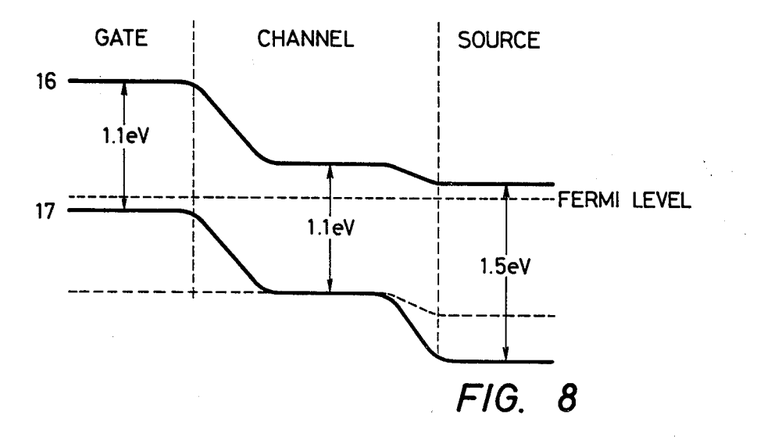
FIG. 8 is a schematic energy band diagram of a source-gate hetero-junction SIT.

When an SIT is constructed using a semiconductor material having a great band gap to form the source region as stated above, the region between the source and gate regions will present a hetero-junction with the intervention of the channel region. In the embodiment of SIT shown in FIG. 6, the source region represents an n type SIPOS, and the channel region is made of an n⁻ type silicon, and the gate region is made of a p⁺ type silicon. In view of the hetero pn junction across the source and gate regions of this SIT, its energy band structure will schematically be as illustrated in FIG. 8.

If the gate region and the source region are made of the same semiconductor material, as in the embodiment shown in FIG. 6, the gate region and the channel region both have a same band gap. However, owing to the difference in Fermi levels thereof, the formation of a junction per se develops a potential difference which constitute a built-in potential $q\phi$[eV]. In the case of silicon, $\phi$ will have a value which may vary somewhat depending on the impurity concentrations of the respective regions, but will have a value of about 0.5 V to about 07 V. The n⁺ type source region 11 made of SIPOS, in contact with the n⁻ type channel region is such that its Fermi level is located close to the bottom of the conduction band, and therefore, the bottoms of the conduction bands of the n⁻ type silicon regions are usually higher than that of the SIPOS region. When the band gap of SIPOS is set at 1.5 eV as shown in FIG. 7, the band gap difference appears mainly in the valence band VB.

In high forward gate bias operations, an appreciable amount of minority carriers is injected into the source region from the channel as shown in FIG. 4. The amount of injected minority carriers into the source region is drastically decreased by introducing a wide band-gap material such as SIPOS into the source region. If the difference in the band gap is designated as $\Delta E_g$, the level of reduction of the amount of the carriers (which, in this instance, are positive holes) which enter into the source region due to the presence of $\Delta E_g$ is the order of $e^{-\Delta E_g/kT}$. If $\Delta E_g$ varies progressively as 0.1 eV, 0.2 eV, 0.3 eV and 0.4 eV, the value of $e^{-\Delta E_g/kT}$, at normal temperatures, will vary accordingly as $2.14 \times 10^{-2}$, $4.56 \times 10^{-4}$, $9.75 \times 10^{-6}$ and $2.08 \times 10^{-7}$. Accordingly if $\Delta E_g$ becomes greater than about 0.1 eV, the flow of the carriers will become more scarce in accordance with an increase in the difference in the band gap between the n− channel and the n+ type SIPOS. This potential barrier definitely serves to prevent injection of minority carriers from the channel region into the source region upon application of a forward bias voltage across the gate and source region to become a gate current. In the case of $\Delta E_g = 60$ milli-eV, the value of $e^{-\Delta E_g/kT}$ becomes about 0.1. This means that the amount of the minority carriers injected from the channel region to the source or the gate region will decrease by one order of magnitude. However, this band gap difference has no effect whatsoever on the value and control of the potential distribution within the channel region in the direction from the source region toward the drain region (which controlls those majority carriers flowing from the source region to the drain region).

In such structure of the device as stated above, those minority carriers (which, in this case, are positive holes) injected from the gate region into the channel region will not be permitted to flow into the source region because they are obstructed by the potential barrier produced by the structure of the present invention. These minority carriers will accumulate within the channel region, and they may either become extinct due to recombination occurring within the channel or at the interface between the channel region and the source region, or they may recombine with a part of those electrons flowing from the source region into the drain region due to the lowered potential barrier of the channel caused by the forward bias applied across the source and gate regions, or they may return to the gate region again when the forward bias applied to the gate is removed or reduced. Thus, the number of those positive holes which enter into the source region as a gate forward current will become very small.

In this way, the injection of minority carriers into the source region is suppressed, so that the gate current can be made extremely small, and thus the problems mentioned above will not come to fore.

In of forming SIPOS as the source region 11, the SIPOS is deposited at a required semiconductor site by relying on the so-called CVD (Chemical Vapor Deposition) method, and thereafter it can be reformed into an n type semiconductor by two-step heat treatment for annealing. SIPOS per se is a semiinsulating material. As stated previously, however, phosphor (P) or boron (B) is doped as an impurity thereto, and by subjecting the resulting SIPOS to two-step heat treatment for annealing, an n type or p type SIPOS having a greater band gap than silicon can be formed. In addition a reduced recombination and trap level at interface with silicon is provided (N. Oh-uchi et al "A New Silicon Heterojunction Transistor Using The Doped SIPOS" Tech. Dig. 1979 IEDM, pp 522–525).

If recombination and trap level at the interface can be reduced, there can be used, as a source region, a material which has a broad band gap, and which allows one to almost ignore the recombination current at the interface between the SIPOS and silicon. Thus, where operation of a normally-off condition SIT is effected by the application of a forward gate bias, the forward current becomes extremely small. Accordingly, the current gain of this SIT can be markedly improved.

The fact that a large current amplification factor can be provided means that the power applied across the source and gate regions can be small. Thus, even where the hetero-junction SIT of the present invention is employed for large power amplification, the SIT can be driven using little power. Therefore, the driving transistor for this purpose can be compact in size, and this is very advantageous.

Also, the fact that the current flowing across the gate and source regions can be made small means that the diffusion capacitance across the gate and source regions can be held small. Thus, the frequency characteristics of the SIT are also improved, making it possible to obtain high power operation while covering a higher frequency. Moreover, as discussed previously, this SIT is also superior when used as a high-power and high-speed switching device.

When a BSIT is rendered to its "on" state, the electrons in the source region pass over the potential gradient of the n type channel, and flow toward the drain region. When such electrons passes below the gate electrode, it is possible that some of these electrons will not flow toward the drain side, but rather will flow into the gate region. This phenomenon tends to be intensive when a large drain current flows or when the potential difference across the pn junction is reduced due to an increased forward voltage applied across the gate and source regions. That is, when the pn junction across the source and gate regions is forward biased, it should be understood that, with respect to only the two terminals of source and gate, only very few minority carriers (which, in case of an n-channel, are electrons) with respect to the gate are injected from the channel into the gate because of the difference in the impurity concentrations of the pertinent regions. However, when majority carriers (which, in case of n-channel, are electrons) are flowing from the source region to the drain region, these majority carriers (which are minority carriers relative to the gate region) flip into the gate region, causing an increase in the gate current as shown in FIG. 5. Thus, problems similar to those discussed previously will come to fore.

In order to suppress the increase in the gate current caused by the abovesaid phenomenon and to reduce the gate current, it is only necessary that, from the concept discussed so far, the p+ type gate region also be formed with a semiconductor material having a band gap greater than that of the channel region, e.g. a p+ type SIPOS which has been described above. An examples of such a device is shown in FIG. 9.

Figure 9:
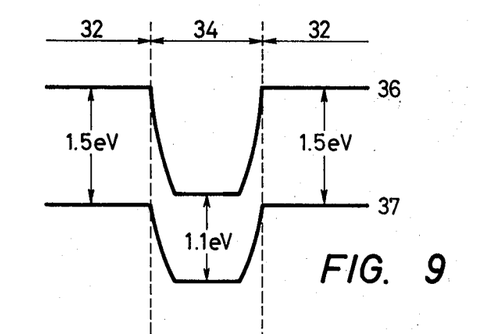
FIG. 9 is a diagrammatic sectional view, showing a hetero-junction SIT structure locally having a doped SIPOS, representing another embodiment of the present invention.

In FIG. 9, numeral 31 denotes an n+ type source region made of SIPOS. The numeral 32 denotes an n− type high resistivity region made of silicon. The numeral 33 denotes an n+ type drain region, 34 denotes a p+ type gate region made of SIPOS. The numeral 35 denotes an insulating layer made of $SiO_2$, $Si_3N_4$, $Al_2O_3$, or AlN. Numerals 31a, 33a and 34a denote a source electrode, a drain electrode and a gate electrode, respectively.

Figure 10:
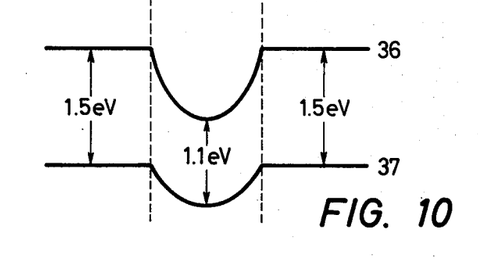
FIG. 10 is a schematic energy band diagram as viewed along the line X''-Y'' in FIG. 9 when the channel region is not completely depleted.
Figure 11:
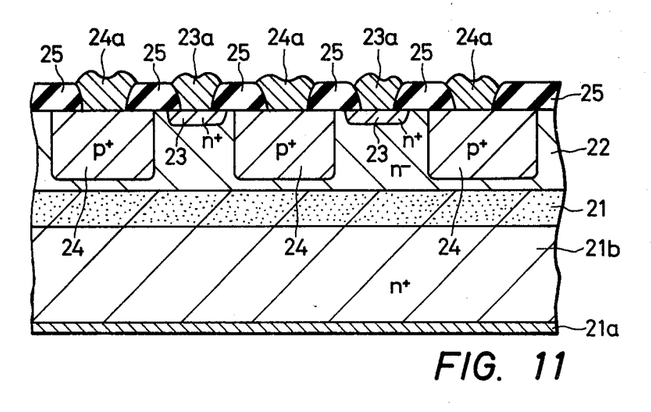
FIG. 11 is a schematic energy band diagram as viewed along the line X''-Y'' in FIG. 9 when the channel region is completely depleted.

FIGS. 10 and 11 show energy band diagrams taken along the line X″-Y″ which is in the cross-sectional direction of the n− type channel region. FIG. 10 shows the state wherein the n− type channel region is not altogether depleted, but rather where a neutral region is retained therein. FIG. 11 schematically shows the instance wherein the channel region is completely depleted, and there is present a potential barrier within the channel for those carriers flowing from the source region to the drain region. Numeral 36 denotes the bottom of conduction band and 37 the top of valence band. As will be best seen in FIG. 10, the band gap of the gate region is greater than that of the channel region. Therefore, if they are made of a same semiconductor material such as silicon, the built-in potential $\phi$ is about 0.5 to about 0.7 V. In such instance, this diffusion or built-in potential is such that the difference in the band gap, i.e. about 0.4 V, is added to the potential $\phi \approx 0.5\text{-}0.7$ V, so that a potential difference of about 0.9–1.1 V is present even without an applied voltage.

As stated above, in an SIT having such hetero-junction structure as described above, even when a forward bias of about 0.8–1.0 V is applied across the source and gate regions to lower the height of or extinguish the potential barrier developed in the channel to thereby allow the carriers to flow from the source region toward the drain region, there still remains a potential difference of about 0.1 V in the center between the p+ type gate region and the channel region, so that those electrons passing through the channel from the source region toward the drain region will find it difficult to flip into the p+ type gate region. In other words, hardly any gate current will flow, and thus a large current gain can be obtained. More specifically, when a forward voltage is applied across the source and gate regions, those positive holes which are injected from the p+ type gate region into the depleted n− type channel region are unable to enter into the source region, being obstructed by the potential difference present at the boundary of the large band gap source region. Thus these positive holes are accumlated within the channel region. On the other hand, those electrons flowing from the source region into the channel region are not injected into the gate region because of the presence of the potential difference by the use of large band gap p+ type gate region. Thus these electrons are allowed to flow, as they are, into the drain region. During accumulation in the channel, a few of the positive holes injected from the gate region into the channel region will undergo recombination either at the interface between the channel region and the source region or within the channel, causing a slight recombination current to arise. However, the majority of the positive holes will only make shuttling movements between the gate region and the channel region in accordance with the changes in the polarity of the source region and the gate region. Thus, such current will, speaking in terms of "effectiveness", be only a slight current caused by changes in capacitance, and the current gain can be made very large.

Figure 13:
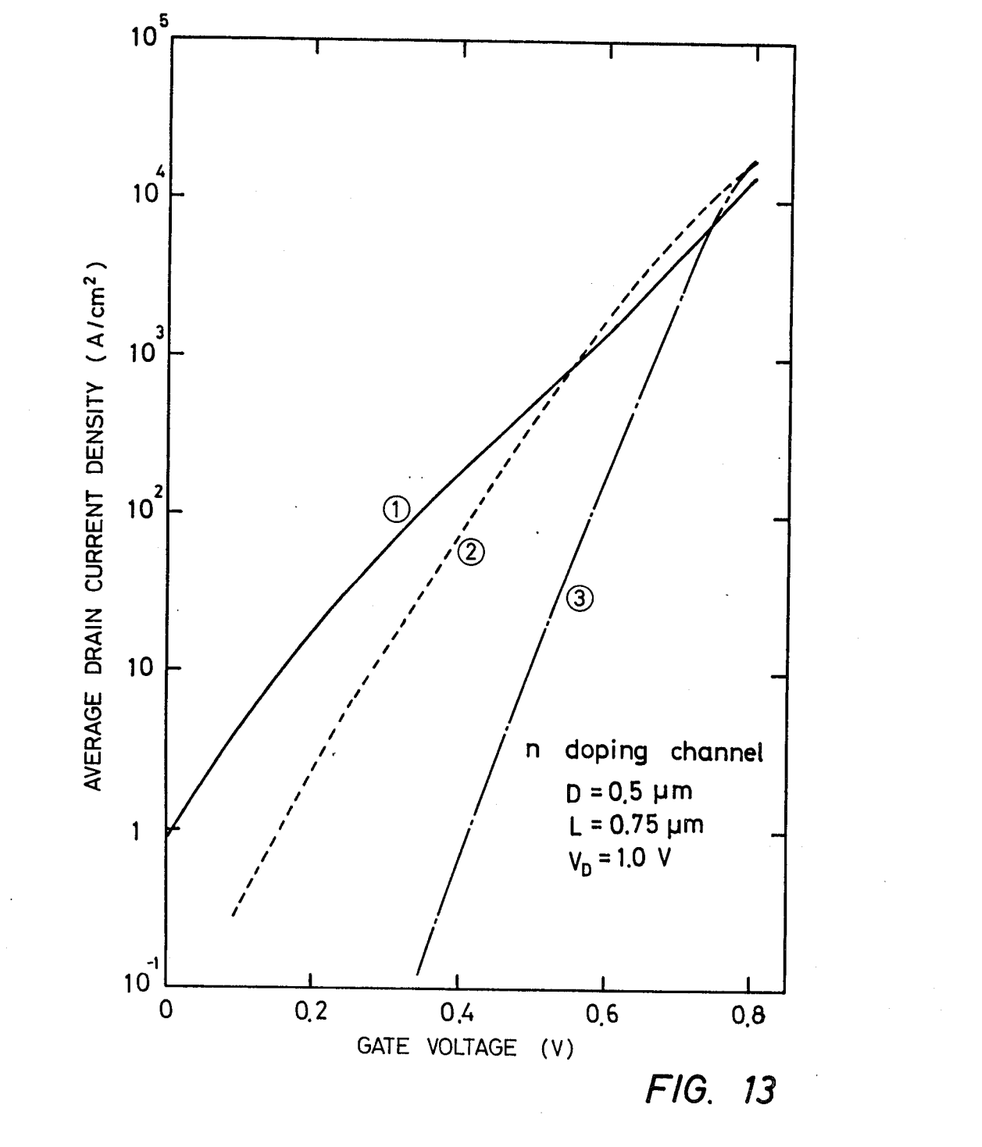
FIG. 13 is a chart showing the relationship between the applied voltage across the gate and source regions of BSIT and the average drain current density.

In addition thereto, owing to the built-in potential which has been made higher by about 0.4 V because of the above-discussed hetero-junction, the depletion layer grows easily within the n− type channel region, and thus such potential barrier as shown in FIG. 2 is easily formed. Accordingly, it becomes easy to manufacture a normally-off type SIT. If the impurity concentration of the n− regions are assumed to be identical, a normally-off type SIT having a large channel can be made, if the gate region is formed with a p+ type SIPOS. More specifically, FIG. 13 shows the relationship between the applied voltage across the gate region and the source region of a BSIT and the average drain current density. In the Figure, curve 1 represents the instance wherein the impurity concentration of the gate region of a homo-junction BSIT is $10^{18}$ cm$^{-3}$, and curve 2 shows the instance wherein it is $10^{19}$ cm$^{-3}$. In order to ensure that a current will not flow easily in the off state of the device and that a current tends to easily flow in the "on" state of the device, it is only necessary to set the impurity concentration of the gate region high. Also, curve 3 represents the instance wherein the gate region is formed with p+ type SIPOS and wherein the band gap is broadened by 0.2 eV. This Figure shows that, by forming the gate region with p+ type SIPOS, the abovesaid tendency becomes even more remarkable, and thus a normally-off type can be obtained more easily. Accordingly, if this BSIT is used in a semiconductor integrated circuit, the current amplification factor is improved, and accordingly, not only a large number of fan-outs can be taken, but also the designing of the integrated circuit becomes easy.

Figure 12:
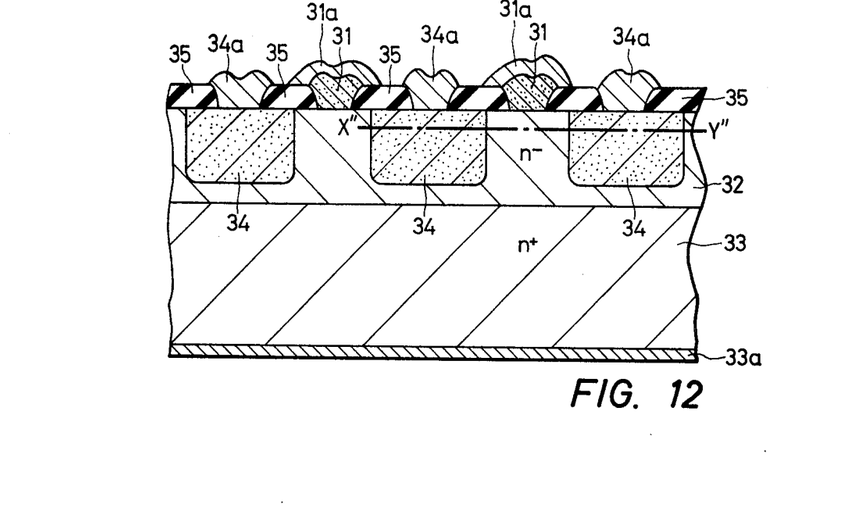
FIG. 12 is a diagrammatic sectional view, showing an upside-down type hetero-junction SIT structure locally having a doped SIPOS.

In the embodiment shown in FIG. 6, the drain electrode side is more convenient for the attachment of a heat-sink plate, rather than on the source region side. This, however, may be reversed. Such example is shown in FIG. 12. In such instance, it is only necessary to provide a SIPOS region 21, for serving as the source region, between the n− type channel region 22 and the n+ type substrate 21b. Numeral 23 denotes an n+ type drain region, and 24 denotes a p+ type gate region, and 25 denotes an insulating film such as silicon oxide (SiO$_2$) film, silicon nitride (Si$_3$N$_4$) film or aluminum oxide (Al$_2$O$_3$) film. Numerals 21a, 23a and 24a denote a source electrode, a drain electrode and a gate electrode, respectively. The doped SIPOS region 21 is not a single crystal. Accordingly, the channel region 22 which is a single crystal region and intended to be epitaxially grown on SIPOS region 21 cannot be grown thereon as a matter of course. In order to achieve a growth of the channel region 22 on the SIPOS region 21, it is effective to form preliminarily, in the surface of this region 21, a pattern such as rectangular pattern, not shown, consisting of many uneven or recessed surfaces of a depth of about 0.1 $\mu$m at a cycle of several to ten-and-several in order to fix the orientation of crystal, and thereafter to deposit silicon on such uneven surface, followed by subjecting the structure to laser-annealing to reform the SIPOS into substantially a single crystal.

In the structure shown in FIG. 12, it is the aim to prevent any flow of forward current is across the p+ type gate region 24 and the wider band gap n type SIPOS region 21. The inhibition of this current flow leads to a high current gain and to a reduced diffusion capacitance, and thus to an improved frequency characteristic. Especially, in case of the upside-down type SIT shown in FIG. 12, it is noted that the area of that side of the gate region 24 which faces the source region 21 is large, so that the effect of improvement of characteristic due to the adoption of hetero-junction is remarkable. To this end, there is no need to form the entire SIPOS region 21 into an n+ type region. It is desirable to arrange so that that portion of the SIPOS region 21 located closer to the p+ type gate region 24 is not doped, and thus retained as a semi-insulating layer. The structure of FIG. 12 is such that a thin n− type high-resistivity region is provided between the p+ type gate region 24 and the n+ type SIPOS region 21. However, from the abovesaid viewpoint, it would be useful for the reduction of the diffusion capacitance to arrange to dispose the p+ type region 24 in direct contact with the semi-insulating SIPOS region, and form the n+ type SIPOS region 21 adjacent thereto. However, when the n+ type SIPOS region 21 and the p+ type gate region 24 are disposed completely in direct contact with each other, the breakdown voltage of the device will drop. Accordingly, there exists an optimum value of the distance between these two opposing regions 21 and 24.

It should be understood that the embodiments of the hetero-junction SIT shown in FIGS. 6 and 12 are each constructed so that the substrate is made of silicon, and that the source region is formed with a doped SIPOS having a great band gap.

Those positive holes (which are minority carriers) injected forwardly from the p+ type gate region to the n− type channel region are prevented from entering into the source region by the potential barrier developed due to the difference in the band gap, and are accumulated in the channel region. Thus, electrons are taken out efficiently from the source region. In other words, no gate current flows, and thus the current gain improves.

Description has been made above with respect to the objects and effects of the present invention by referring to embodiments of silicon junction SIT using SIPOS having a band gap greater than that of silicon as the source region or the gate region. It should be understood from the foregoing description, however, that the present invention is not limited to silicon, nor to SIPOS when silicon is employed.

In the case where, for example, silicon as a semiconductor material is used to form the channel region of a junction SIT, it is only necessary that the source region or the gate region or both employ a semiconductor material having a band gap greater than that of silicon. Thus, there is no need to use the abovesaid SIPOS for such regions. It should be noted, however, that in order to expect an effective use of the present invention, it is desirable that there are few levels formed at interface of the hetero-junction which will serve as the recombination centers or carrier traps. If, for example, GaAs having a band gap $E_g \approx 1.43$ eV is used as a semiconductor material to form the channel region of a junction SIT, the source region or the gate region could be formed from such crystals as $Ga_{1-x}Al_xAs$ or $Ga_{1-x}Al_xAs_{1-y}P_y$ (a material having a band gap greater than that of GaAs), while controlling their composition. A mixed crystal $Ga_{1-x}Al_xAs$ will have varying band gap by varying the value of the composition "x", and will assume intermediate values between the value 1.4 eV of GaAs and the value 2.16 eV of AlAs. If x=0.35, the band gap of $Ga_{0.65}Al_{0.35}As$ is about 1.9 eV at room temperature, so that it can be used as a material having a band gap greater by about 0.45 eV than that of GaAs, when x=0.35. If $x \approx 0.1$, the band gap thereof will become greater by about 0.1 eV. The band gap difference may be set to suit the use of the SIT.

Figure 14:
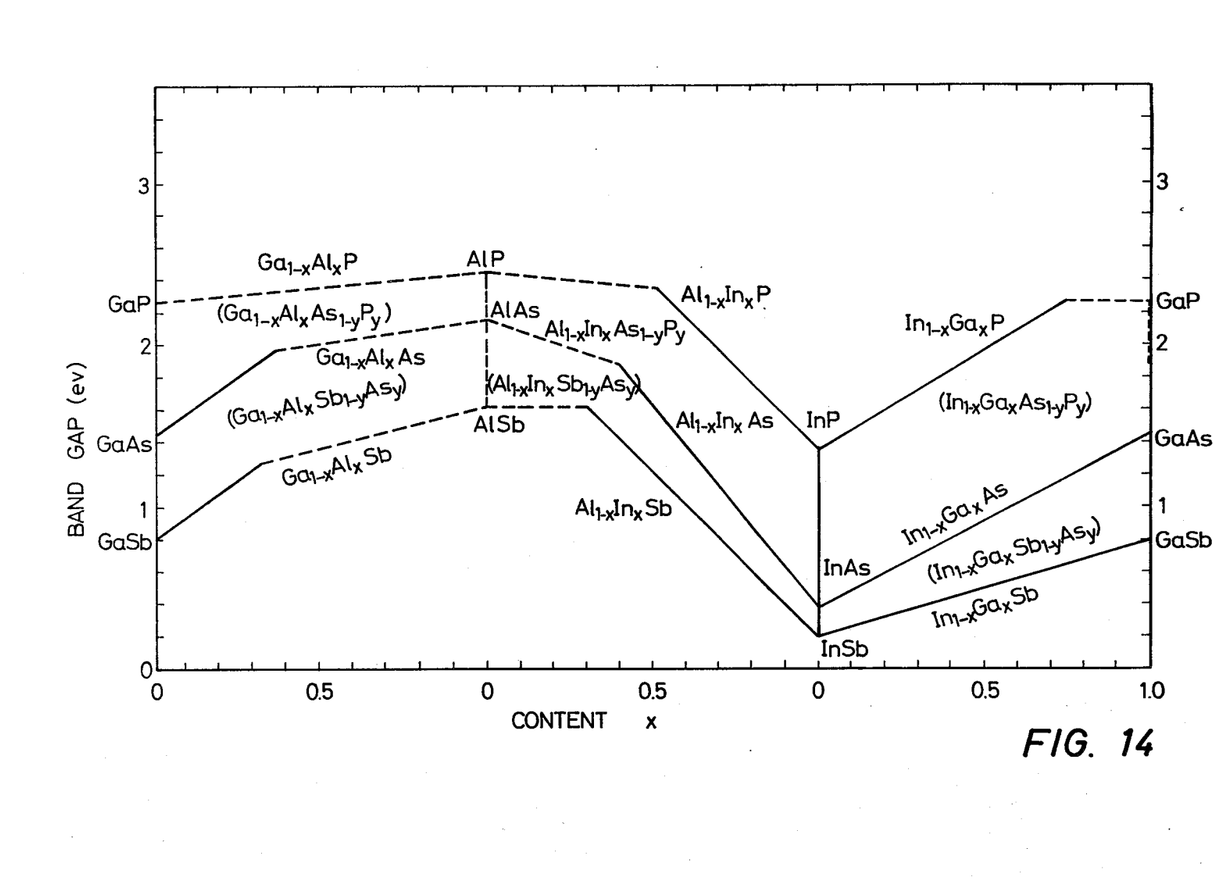
FIG. 14 is a chart showing the band gap of ternary group III-V compound semiconductors.
Figure 15:
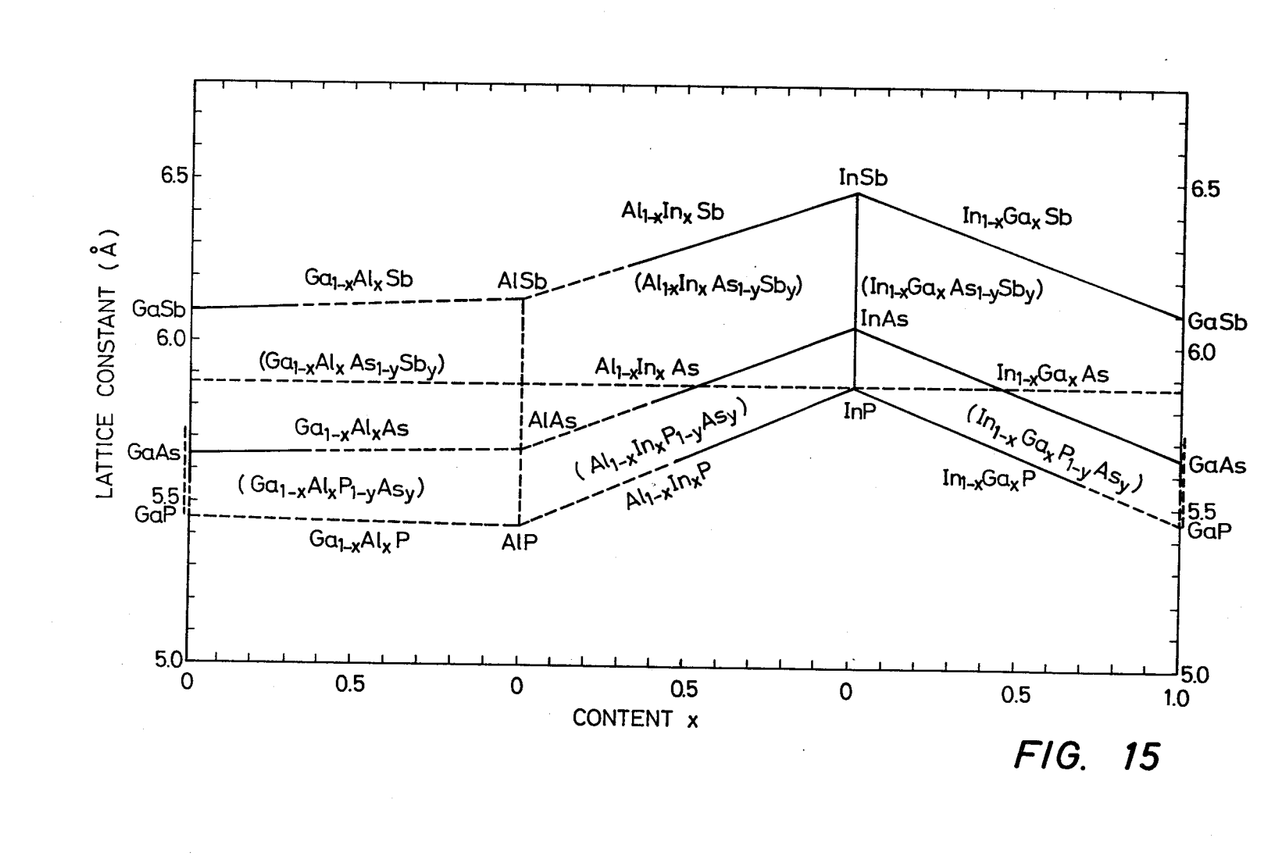
FIG. 15 is a chart showing the lattice constant of ternal group III-V compound semiconductors.

Band gap of ternary group III-V compound semiconductors are roughly illustrated in FIG. 14 for various contents. FIG. 14 indicates the variations of band gap of ternary group III-V compounds semiconductors such as $Ga_{1-x}Al_xAs$, $Ga_{1-x}Al_xSb$, $Ga_{1-x}Al_xP$, $In_{1-x}Ga_xAs$ and so on. In the case of a hetero-junction device, fitting of the lattice constant is very important to reduce interface recombination, and thus increase the current gain. The variations of the lattice constant of the above-mentioned ternal group compound semiconductors are also illustrated in FIG. 15.

Description will now be made of the improvement of the characteristics of a semiconductor integrated circuit utilizing the hetero-junction SIT of the present invention.

Figure 16:
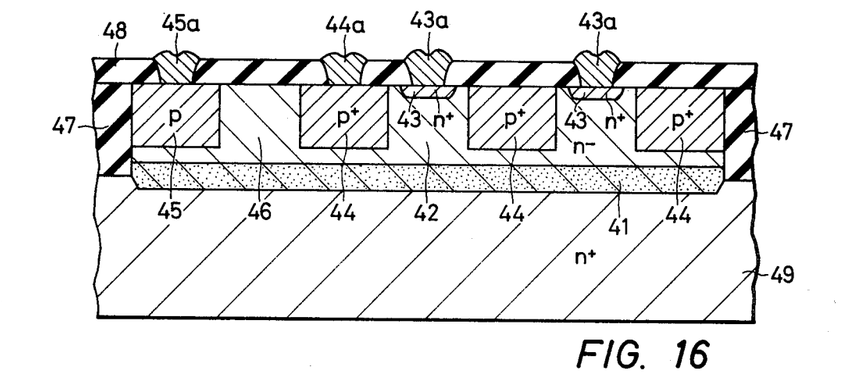
FIG. 16 is a diagrammatic sectional view, showing an IIL integrated circuit model structure using a hetero-junction SIT.

FIG. 16 is a partial sectional view of an embodiment of a semiconductor integrated circuit representing a logic circuit which is usually called IIL (Integrated Injection Logic).

In the Figure, numerals 41 to 44 denote regions which form the hetero-junction SIT serving as a driver. Numeral 43 denotes an n+ type drain region, 42 an n− type or p− type channel region, 41 a source region formed with an n+ type doped SIPOS, and 44 a p+ type gate region. The dimension and the impurity concentration of the n− type channel region 42 are such that the n− type channel region 42 is perfectly depleted due to the built-in potential caused by its junction with the p+ type gate region 44, and that a high potential barrier is produced within the channel region 42. That is, a normally-off type SIT is formed. Similarly, if the channel region 42 was formed a p− type region, its dimensions and impurity concentration would be selected so that this region was likewise almost or perfectly depleted. Regions 44 to 46 jointly form a lateral bipolar transistor which, in turn, constitutes an injector. Numeral 45 denotes an emitter region, 46 a base region, and 44 a collector region, respectively. Numerals 47 and 48 denotes insulating films of such material as $SiO_2$, $Si_3O_4$, $Al_2O_3$ or AlN. All of these regions and films are formed on an n+ type substrate 49. It should be understood that this substrate may be a p− type region. In such instance, however, the buried SIPOS region 41 would be wired at the semiconductor surface via a low resistivity region. Numeral 45a denotes a region which serves as an electrode of the injector, 44a a region serving as an input electrode, and 43a a region serving as an output electrode. Uneven portions (not shown) having a depth of about 0.1 μm at a cycle of several to ten and several micrometers are formed in the surface of the buried n+ type SIPOS region 41 as explained in connection with the embodiment of FIG. 12. A forward bias is applied across the junction of the gate region 44 and the source region 41 of the driver SIT. However, as stated previously, the region 41 is formed with a doped SIPOS, so that essentially no forward gate-to-source current is caused by the injection of holes from the gate region 44. Therefore, even where the source region 41 is formed within the interior of the device as in this case, (which may be called an upside-down type device) a large current gain, can be obtained and the fan-outs can be taken in a large number. Also, due to the elimination of the storage effect of minority carriers, it is possible to make the propagation delay time small. If, in this structure, the p+ type gate region 44 also is formed with a p+ type SIPOS region, the current gain of the hetero-junction SIT which serves as the driver will be improved all the more, and the characteristic thereof will be improved further. If, concurrently therewith, the channel region 42 is formed with an n− type region, the resulting discrete device may be as that described with respect to the above-stated embodiments of SIT. In such case, the built-in potential at the p+n− junction will become high, and thus a normally-off type can be easily formed. Also, if the p+ type injector region 45 is formed with a p+ type SIPOS, essentially no current will flow across the regions 45 and 41, so that the current supplied from the power supply can be effectively used. If the logic swing is large, there will arise the instance wherein a forward bias is applied across the gate region 44 and the drain region 43 of the driver transistor. In such instance, it should be understood that, by forming the drain region 43 also with a doped SIPOS to provide a hetero-junction across the gate and drain regions, it is possible to avoid an increase in the capacitance across the gate and drain regions, and to prevent an increase in the propagation delay time. An improvement similar to that stated above can be attained by applying the hetero-junction SIT of the present invention to such semiconductor integrated circuits as STL (Schottky Transistor Logic) or CML (Current Mode Logic).

Figure 17:
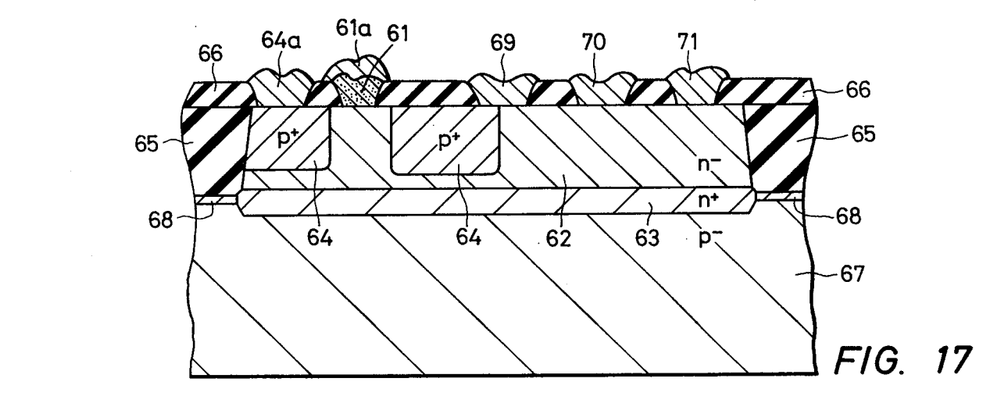
FIG. 17 is a diagrammatic sectional view, showing an STL integrated circuit model structure using a hetero-junction SIT.

FIG. 17 shows a structural view of a section of an embodiment of STL using the hetero-junction SIT.

In the Figure, numerals 61 to 64 denote regions which form a hetero-junction SIT serving as a driver. Numeral 61 denotes a source region using an n+ type doped SIPOS. Numeral 62 denotes an n− type or p− type channel region, and numeral 63 an n+ type drain region. 64 denotes a p+ type gate region, and 65 and 66 denote insulating films made of, for example, oxide films. All of these regions and films are formed on a p− type substrate 67. Numeral 68 denotes a channel stopper made of a p type region which is provided to avoid mutual interference between adjacent gate regions due to the formation of a channel below the oxide film 65 (which is intended to isolate the adjacent gate regions). Numeral 61a denotes a ground electrode, and 64a an input electrode. Numeral 69 denotes an electrode for forming a Schottky barrier diode intended to clamp the voltage across the gate and drain regions. A load is usually a polysilicon resistor which is formed on top of the insulating film 66. Numerals 70 and 71 denote regions serving as output electrodes and constitute Schottky barrier diodes for forming wired logic. The logic swing for the STL is given by the difference between the forward voltage drop $V_f$ of the gate-clamping Schottky diode and the forward voltage drop $V_f$, of the output Schottky diodes 70 and 71. Accordingly, such diode is made with a metal, e.g. Titanium (Ti), which will render the value of $V_f$ as small as possible. When the driver SIT is rendered conductive, a forward bias of value $V_f$ is applied across the gate and drain regions. Accordingly, the diffusion capacitance across the gate and drain regions tends to become large. In order to prevent such an increase in the diffusion capacitance, it desirable to dispose the p+ type gate region is in direct contact with the n+ type drain region. However, when the entire p+ type gate region 64 and the entire n+ type drain region 63 are in direct contact, the breakdown voltage of the device will drop. Accordingly, an optimum value of the distance between these two opposing regions 64 and 63 exists. In the case of silicon, the diffusion capacitance will exhibit little increase until $V_f$ takes a value of about 0.6 V, and the junction across the gate and drain regions will be held only at the junction capacitance. If $V_f$ takes a larger value, it is only necessary to replace both the p+ type gate region and the n+ type drain region by a p+ type SIPOS and an n+ type SIPOS, respectively. If, however, the drain resistance becomes large when the drain region is formed by an n+ type SIPOS, and thus, a difficulty in the operation of the device arises, it is only necessary to form a thin n+ type region in the p− type silicon substrate beneath the n+ type SIPOS and in contact therewith. Although an instance wherein an STL is formed on a p− type substrate 67 is shown in FIG. 17, it should be understood that, a further high-speed operation, can be provided by using a p+ type substrate and provides a p− type or i type high-resistivity region to intervene between the n+ type drain region and the p+ type substrate, where the thickness and the impurity concentration of the high-resistivity region are selected so that this region is almost or perfectly depleted by the built-in potential across the region and the n+ type drain region. Also, in the embodiment shown in FIG. 17, the region located between the n+ type drain region 63 and the output Schottky diode located at the surface is an n− type region. It should be noted, however, that such region may be an n+ type region for the purpose of reducing resistance. However, it should be understood that, in such case, it is mandatory that the impurity concentration of that portion of said n+ type region located close to the surface thereof be low compared to such level for the channel region 62. Since a doped n+ type SIPOS is used to form the source region 61, it is possible to reduce the gate current, and thus the characteristic can be improved. Since the source region is disposed at the surface of silicon, the device has the advantage that it can be manufactured easily as compared with the structure shown in FIG. 16. If the p+ type gate region 64 is formed using a p+ type SIPOS, the current gain will improve further.

As a matter of course, the hetero-junction SIT can also be applied to ISL (Integrated Schottky Logic) (a logic gate resembling STL).

Figure 18:
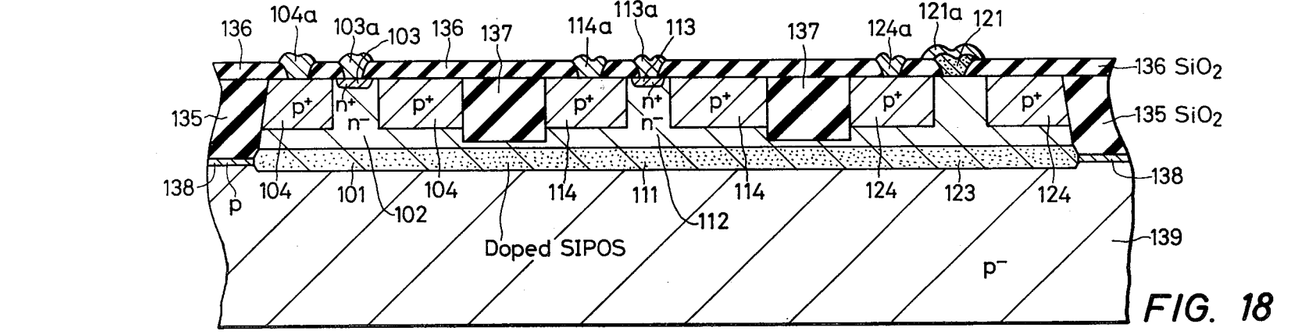
FIG. 18 is a diagrammatic sectional view, showing a CML integrated circuit model structure using the hetero-junction SIT of the present invention.

FIG. 18 shows a structure of a section of an embodiment of CML using the hetero-junction SIT of the present invention. Regions 101, 102, 103 and 104 and regions 111, 112, 113 and 114 constitute upside-down type transistors which form differential pairs. Regions 121, 122, 123 and 124 constitute a normal transistor which is used to provide a constant current through said differential pair transistors. Regions 103 and 113 represent n+ type drain regions. Regions 102, 112 and 122 constitute n− channel regions. Regions 104, 114 and 124 constitute p+ type gate regions. The source regions 101 and 111 of the transistors forming differential pair, and the drain region 123 of the transistor forming a constant current source are formed by a doped n+ type SIPOS as a common region. In order to render the silicon located on the SIPOS a single crystal, the surface of this SIPOS is provided either one-dimensionally or two-dimensionally with uneven portions of about 0.1 μm at a cycle of several micrometers or of ten and several micrometers as in FIG. 12. The source region 121 of the transistor which constitutes a constant current source also is formed with a doped SIPOS. It should be understood that this region may be formed with an n+ type silicon, as a matter of course. Regions 135, 136 and 137 represent insulating films made of a material such as $SiO_2$, $Si_3N_4$, $Al_2O_3$ or AlN. Region 138 represents a channel stopper, and region 139 a p− type substrate. Regions 103a, 104a, 113a, 114a, 121a and 124a represent metal electrodes. The electrodes 114a and 124a are supplied with a predetermined bias voltage. The electrode 104a represents an input electrode. Non-inverting and inverting outputs are derived at the electrodes 103a and 113a, respectively. Although resistor is not shown, there may be used, for example, a diffused layer, a polycrystalline layer or a transistor to serve as the resistor. Such resistor is connected to the electrode 103a, 113a and 121a. The source regions 101 and 111 of the SIT's which form differential pair are formed with a doped n+type SIPOS, so that the current amplification factor and the frequency characteristic are improved. Accordingly, an increase in the number of fan-outs and a reduction of propagation delay time are feasible. The source region 121 also of the SIT serving as the constant current source is formed with a doped n+ type SIPOS, so that the current amplification factor is improved.

Needless to say, if the p+ type gate regions 104 and 114 are formed with a p+ type SIPOS, the current gains of the hetero-junction SIT's which constitute driver transistors of operation pair will be enhanced further.

In the structure shown in FIG. 18, the p+ type gate region is separated separate from the n+ type SIPOS. If these two regions are in direct contact with each other, the built-in capacitance across the gate and source regions of each of the differential pair transistors would be reduced, so that the operating speed will be enhanced. However, when the p+ type gate regions 104 and 114 and the n+ type source regions 101 and 111 are so in direct contact, the breakdown voltage of the integrated circuit will drop. Accordingly, an optimum value of the distance between these respective two opposing regions exists.

FIG. 18 shows an instance wherein an n+ type SIPOS is provided on a p− type substrate. If, however, the resistance of this region becomes problematical, it is only necessary to form that portion of silicon located below the n+ type SIPOS as an n+ type only for a required thickness. It is also effective to provide a p+ type substrate and to arrange a high-resistivity region to intervene therein.

The hetero-junction SIT's which form differential pair may be of normal (as opposed to upside-down) type. In such case, an electrical connection between the source regions 101 and 111 of the differential pair transistors and the drain region 123 of the constant current sourse transistor at the semiconductor surface must be established. The packing density, therefore, may drop somewhat, but the manufacturing process becomes simplified.

Description has been made of some embodiments of semiconductor integrated circuits using hetero-junction SIT's formed by a combination of silicon and SIPOS. Combinations of GaAs and $Ga_{1-x}Al_xAs$ or a combination of $Ga_{1-x}Al_xAs_{1-y}P_y$ or any other combinations can also be utilized.

It should be apparent from the foregoing that the characteristics of various types of semiconductor integrated circuits can be improved by the use of the hetero-junction SIT's having a structure according to the present invention.

It should be appreciated that the SIT according to the present invention is not limited to those structures shown and described herein. The SIT's may be of the type wherein the conductivity types of the constituting regions are reversed. Also, structures thereof is not limited to the surface gate structure, but it may be of the buried gate type or the recessed gate type. In any case, it is only necessary that at least the source region of SIT (which can be operated by applying a forward bias across the gate and source regions) be formed with a material having a band gap greater than that of the channel region. For example, a SIPOS is used for silicon, and $Ga_{1-x}Al_xAl$, or $Ga_{1-x}Al_xAs_{1-y}P_y$ for GaAs.

In an SIT of the present invention wherein at least the source region is formed with a material having a band gap greater than that of the channel region, the current amplification factor is large, and its frequency characteristic is improved, thus providing an SIT which is superior when used for high power operation or for semiconductor integrated circuits, and thus its industrial value is very high.

What is claimed is:

1. A hetero-junction static induction transistor, comprising:
   a source semiconductor region;
   a drain semiconductor region, said source and drain regions having a first conductivity type and a high impurity concentration;
   a gate semiconductor region having a second conductivity type opposite to said first conductivity type and a high impurity concentration;
   a channel semiconductor region having a high resistivity; and
   a built-in depletion layer extending across and completely depleting said channel region, said source region and said gate region each having a band gap greater than that of said channel region and forming a hetero-junction with said channel region.

2. A hetero-junction static induction transistor according to claim 1 wherein said drain region has a band gap greater than that of said channel region.

3. A hetero-junction static induction transistor according to claim 1 or 2, in which:
   said channel region is formed of silicon, and at least one region having a band gap greater than that of said channel region is formed with low-resistivity SIPOS.

4. A hetero-junction static induction transistor according to claim 1 or 2, in which:
   said channel region is formed with gallium-arsenide, and
   at least one region having a band gap greater than that of said channel region is formed with a semiconductor material selected from the group consisting of gallium-aluminum-arsenide and gallium-aluminum-arsenide-phosphorus.

5. A semiconductor integrated circuit containing, as a driver transistor a hetero-junction static induction transistor according to claim 1 or 2.

* * * * *